United States Patent
Tessarolo et al.

(10) Patent No.: US 7,495,429 B2
(45) Date of Patent: Feb. 24, 2009

(54) APPARATUS AND METHOD FOR TEST, CHARACTERIZATION, AND CALIBRATION OF MICROPROCESSOR-BASED AND DIGITAL SIGNAL PROCESSOR-BASED INTEGRATED CIRCUIT DIGITAL DELAY LINES

(75) Inventors: Alexander Tessarolo, Lindfield (AU); David A. Figoli, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/290,959

(22) Filed: Nov. 30, 2005

(65) Prior Publication Data

US 2006/0156150 A1    Jul. 13, 2006

Related U.S. Application Data

(60) Provisional application No. 60/636,233, filed on Dec. 15, 2004.

(51) Int. Cl.
*G01R 23/175* (2006.01)
(52) U.S. Cl. ................... 324/76.54; 324/76.35

(58) Field of Classification Search .............. 324/76.54, 324/76.35
See application file for complete search history.

(56) References Cited

U.S. PATENT DOCUMENTS 6,091,891 A * 7/2000 Overall et al. ............... 358/1.13
6,390,579 B1 * 5/2002 Roylance et al. ............... 347/9

* cited by examiner

*Primary Examiner*—Vincent Q. Nguyen
*Assistant Examiner*—Amy He
(74) *Attorney, Agent, or Firm*—Frederick J. Telecky, Jr.; Wade J. Brady, III

(57) ABSTRACT

A circuit board with a processing unit and a delay line with a controllable number of delay elements fabricated thereon includes apparatus for testing and calibrating the delay line elements. In the test mode, a calibrated pulse is delayed by the delay line while determining the logic state of pulse at two times, the interval between the two times being the same as the pulse width. By adding delay elements, the period of the calibrated pulse as a function of number of delay elements can determine the delay of each delay element. In the calibration mode, the delay line is configured as a ring oscillator and the frequency of the ring oscillator as a function of number of delay elements provides the time delay for the individual elements.

5 Claims, 6 Drawing Sheets

APPARATUS AND METHOD FOR TEST, CHARACTERIZATION, AND CALIBRATION OF MICROPROCESSOR-BASED AND DIGITAL SIGNAL PROCESSOR-BASED INTEGRATED CIRCUIT DIGITAL DELAY LINES

This application claims priority of U.S. Provisional Application No. 60/636,233, filed Dec. 15, 2004.

BACKGROUND OF THE INVENTION

1. Field of the Invention

This invention relates generally to integrated circuit delay lines, and more particularly to the test, characterization, and calibration of delay lines in microprocessors and digital signal processors.

2. Background of the Invention

Programmable digital delay lines, delay lines fabricated from N equal delay elements, are important components in microprocessor and digital signal processor devices. Examples of the applications of these devices include: providing accurate delay signals edges for the purpose of correcting/adjusting signal skews; accurately adjusting the width of a pulse to a finer resolution than is possible with the device system clock (especially pulse width modulation {PWM}); and generating frequencies at finer resolution steps using a ring oscillator technique than is possible with a system clock.

Referring to FIG. 1, a typical controllable digital delay line is illustrated. The delay line is a plurality of series coupled delay elements $d_0$ through $d_{N-1}$. Coupled to the output terminal of each delay element $d_n$ is the input terminal of gate $g_n$. A multiplexer 11 activates gate $g_n$ in response to a numerical value n. In this manner, in response, to an input value of n, the gate $g_n$ is activated. Thereafter, a pulse applied to the DELAY IN terminal of the delay element $d_0$ will be transmitted to the output terminal of gate $g_n$. The input pulse is therefore delayed by gates $d_0$ through $d_n$, and is applied to the DELAY OUT terminal.

Because geometry determines the characteristics of the delay elements, each delay element can be designed to match the other delay elements. However, this matching only insures relative delay element accuracy. More importantly, a "measure" of the absolute delay for each delay element is needed to have a useful value in an application. This absolute value needs to be dynamically determined over temperature and process variations. The embedded delay structure operates within a clocked system (i.e., necessary for microprocessor devices or digital signal processor deices), the clocked system usually based on a quartz crystal. If a determination can be made as to how many delay elements give a delay equal to the system clock period, $T_{sys}$, of the system, then important calibration information needed to program the delay structure with absolute times is provided.

Referring to FIG. 2, an example how m delay elements are needed to span a 100 nS system clock is shown. (Note the assumption is that the delay structure is designed with a sufficiently large number of delay elements to span the width of the system clock under both temperature and process variations.) When m is known, absolute time delay values ranging from $0-T_{sys}$ can be programmed according to the following relationship:

$$D_{abs}(i) = T_{sys} * i/m$$

Although the advantages of using delay lines are well-known, problems have been found when delay lines are embedded in integrated circuits. Two important areas that should be addressed to derive the full benefit of the embedded delay lines are 1.) the test and characterization during the manufacturing process, and 2.) the delay line calibration in the field.

With respect to the testing and the characterization during the manufacturing process, the delay structures are embedded in microprocessor and digital signal processor devices and, consequently, share the same process technology, i.e., high density complementary metal oxide semiconductor (CMOS) technology. Delay values for each device can be on the order of 100 ps. Even expensive and sophisticated chip testers can have problem resolving the timing resolution required to test and characterize such delay elements. Moreover, accessing such elements via device pins introduces large amounts of input/output (I/O) pad delays, thereby skewing the actual measurement itself.

With respect to the field calibration, although each delay element can be made equal to the other delay elements, (achieved by equal geometry), process and temperature variations prevent identical absolute delay values. For the delay structures to be useful in an application, the dynamic determination of the absolute value of the delays is necessary for use in a background calibration scheme.

A need has therefore been felt for apparatus and an associated method having the feature of improved determination of the delay line characteristics. It is another feature of the apparatus and associated method provide a stand-alone test and characterization of a delay line in an integrated circuit. It would be a further feature of the apparatus and associated method to provide test and characterization techniques involve frequency and period-based techniques. It would be a still further feature of the apparatus and associated method to permit data relevant to the test and characterization of a delay line to be analyzed either with an associated processing unit or external testing equipment. It is still a further feature of the apparatus and associated method to provide an iterative calibration method based on counters averaged over time. It would be a more particular feature of the apparatus and associated method to provide an iterative calibration technique that is tolerant to noise and to meta-stability. It is still another feature of the apparatus and associated method to provide a characterization scheme that can run concurrently with an application program.

SUMMARY OF THE INVENTION

The foregoing and other features are accomplished, according the present invention, by providing a delay line having plurality of selectable elements. In a test mode, a calibration pulse generator provides a pulse that has period of one system clock. The pulse is then entered in the delay line and, after a system clock cycle delay, the logic states of the output signal of the delay line is determined one system clock period apart. As the calibration pulse is delayed, the number of delay elements equal to the system clock period can be determined. In a calibration mode, the delay line with a controllable number of delay elements has an inverting amplifier coupled between input and the output terminal, thereby forming ring oscillator. The frequency of the ring oscillator for a known number of delay elements in the delay line permits the delay parameter of each delay element to be determined.

Other features and advantages of present invention will be more clearly understood upon reading of the following description and the accompanying drawings and the claims.

1. DETAILED DESCRIPTION OF THE FIGURES

Figure 1:
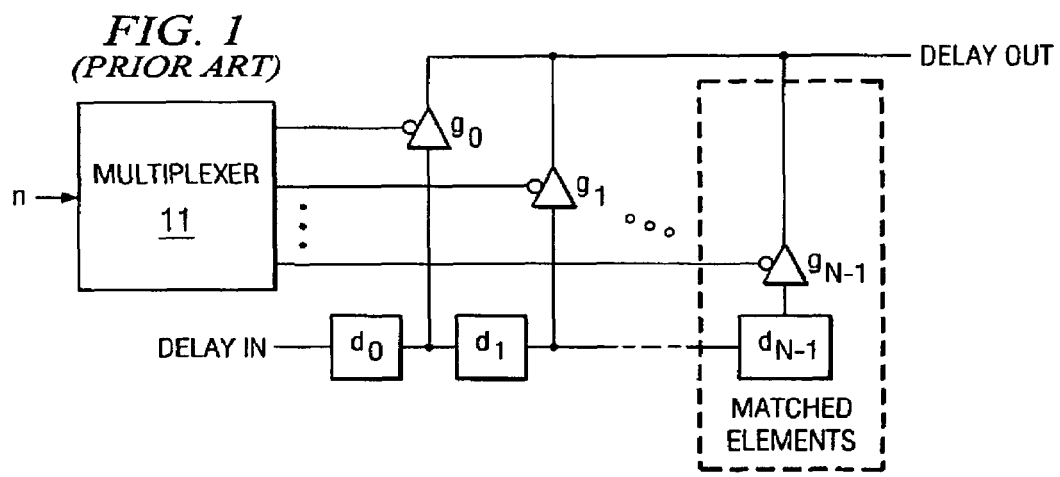
FIG. 1 is a block diagram of a controllable digital delay line according to the prior art.
Figure 2:
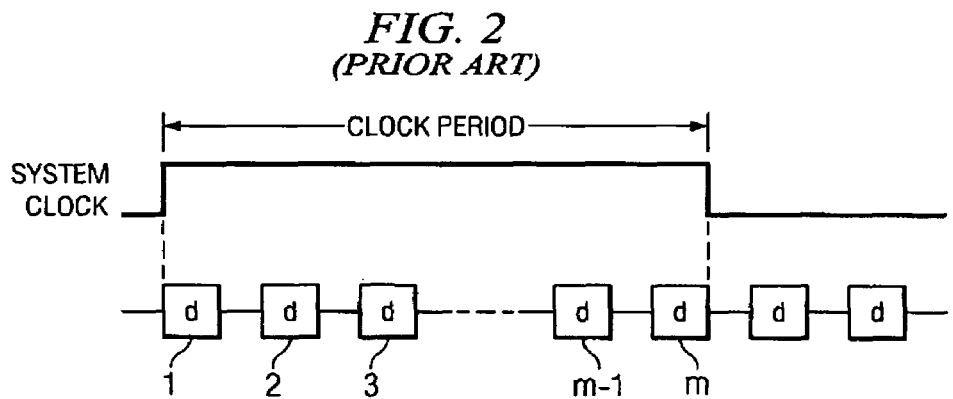
FIG. 2 illustrates m delay elements causing a signal delay equal to the system clock.

FIGS. 1 and 2 have been described with respect to the prior art.

Figure 3:
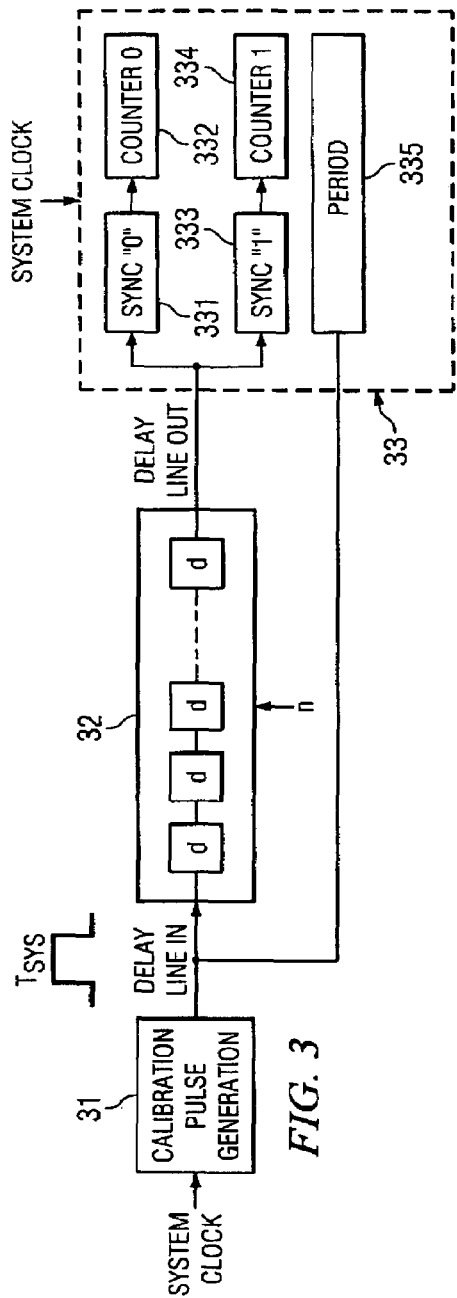
FIG. 3 is a block diagram of the components for calibrating a delay line according to the present invention.

Referring next to FIG. 3, a block diagram of a calibration system according to the present invention is shown. The system clock signal is applied to the input terminal of a calibration pulse generator 31. The output terminal of the calibration pulse generator 31 provides a pulse of duration $T_{SYS}$ that is applied to a period counter and to delay line 32. Delay line 32 has a multiplicity of delay elements d. A multiplexer, shown in Fig. 2, selects n delay elements. The generated pulse is delayed by the selected n delay elements in delay line 32 and the delayed pulse is applied to synchronization units, SYNC (0) unit 331 and SYNC(1) unit. The output signals from the SYNC(0) unit 331 are applied to CNT0 unit 332 and the output signals from SYNC(1) unit 333 are applied to CNT1 unit 334. The SYNC(0) unit 331 and the SYNC(1) unit 333 sample the delayed calibration pulse and determine when the logic state of the pulse is a logic 0 or a logic 1, respectively. The SYNC(0) unit 331 generates a pulse when the unit identifies a logic 0 and the SYNC1 unit generates a pulse when the unit identifies a logic 1 signal. The output signals are counted in the counter to which the SYNC unit is coupled.

Figure 4:
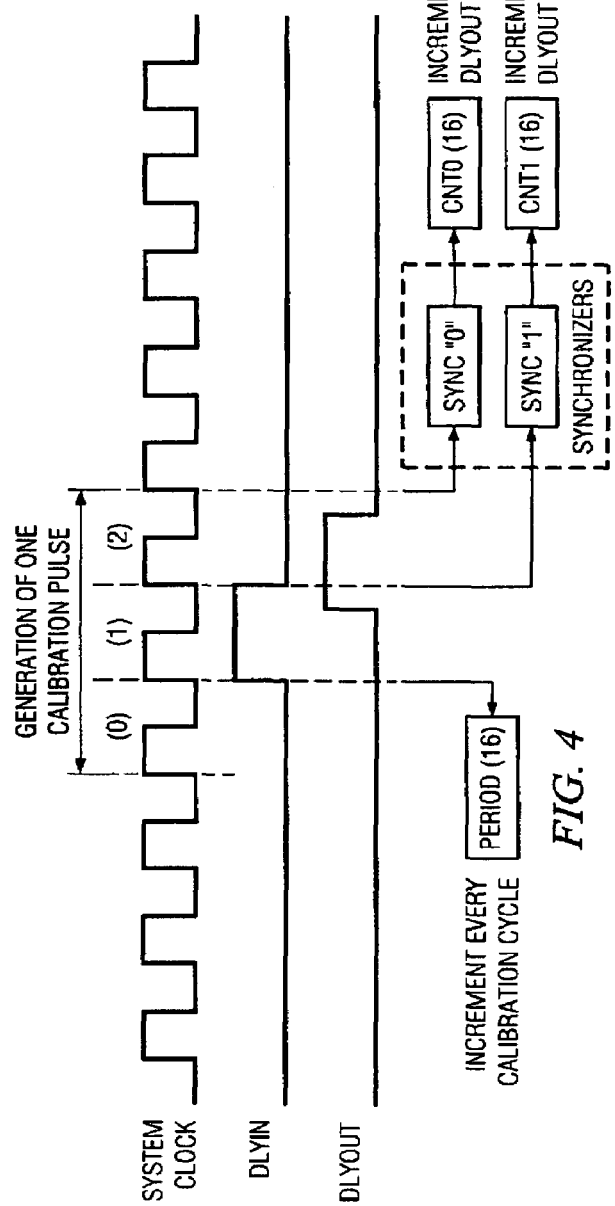
FIG. 4 illustrates the operation of the test apparatus shown in FIG. 3 according to the present invention.

Referring to FIG. 4, the operation of the apparatus of FIG. 3 is illustrated. The system clock provides a sequence of pulses. Based on the system clock, the calibration pulse generator (31 in FIG. 3) applies a calibration pulse to the DLYIN terminal of the delay line (32 in FIG. 3). The application of the calibration pulse to the delay line results in a count being entered in the period counter (335 in FIG. 3). After the calibration pulse is applied to the delay line, the output signal of the delay line (the DLYOUT terminal) is sampled at the beginning of each clock pulse. When the sampling identifies a logic "1", the SYNC(1) unit increments the CNT1 counter. When the sampling of the delayed pulse identifies a logic "0", the SYNC(0) unit increments the CNT0 counter.

Figure 5:
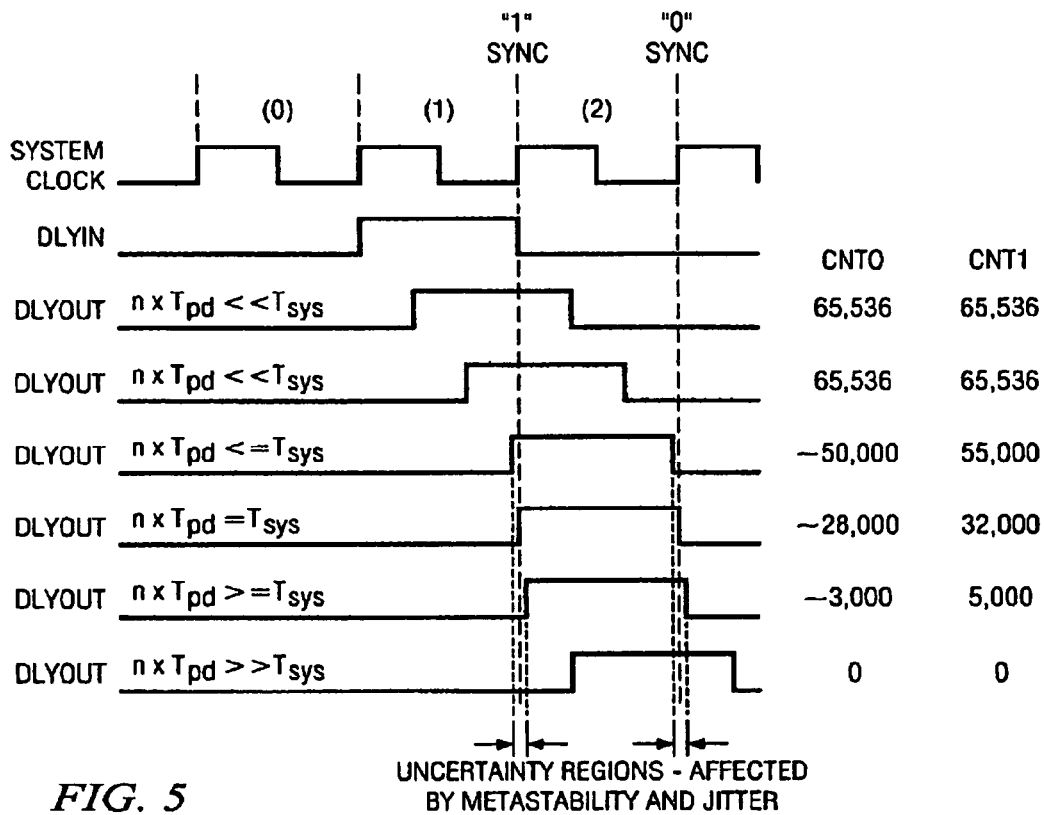
FIG. 5 illustrates the results of varying the delay of the delay line on the counts entered in the SYNC counters according to the present invention.

Referring to FIG. 5, the effect of varying the number (n) of elements that have been activated in the delay line (i.e., 32 in FIG. 3) is illustrated. The top graph of FIG. 5 shows the system clock signal. The second graph of FIG. 5 shows the relationship of the calibration pulse to the system clock. Graph 3 illustrates the situation wherein the number of elements activated by the delay line results in a delay less that the system clock period. In the example, when CNT0 and CNT1 are 16 bit counters, the number of pulses generated by SYNC (0) and SYNC(1) are CNT0=CNT1=65,536. In graph 4 where the delay of the calibration pulse is greater than that shown in graph 3 but still less the period of the system clock, the same counter results are obtained. In graph 4, the delay of the calibration pulse through the delay line is greater than the delay illustrated in graph 3, but still less than the period of the system clock. In this situation the contents of CNT0 and CNT1 will be the same as for graph 3. In graph 5, the length of the calibrated pulse delay is only slightly less than the system clock period. In this situation, the uncertainties in the generation and propagation of the calibration signal will result in a jitter of the edges of the calibration pulse. Therefore, when the SYNC0 and the SYNC1 sample the logic state at the leading edges of consecutive clock cycles, the logic state can be different from the logic state detected for a calibration pulse with jitter-free edges. Therefore, the count in the counter CNT0 and CNT1 will be less than the maximum possible count, i.e., approximately 55,000 counts in each counter. In the sixth graph, the delay is exactly equal to one clock cycle. Once again however, the jitter of the edges of the calibration pulse result will result in the wrong logic state being identified approximately 50% of the time. In addition, in some sampling of the delay line output signals the logic state will be indeterminate. Therefore, the count in (16 bit) counters CNT0 and CNT1 is listed as approximately 32,000. In graph 7, the calibration pulse delay is slightly greater than a system clock period. Although most of the sampling will provide a 0 count, (i.e., the logic state sampled the SYNC0 and SYNC1 will not be observed). However, because of the jitter, a small residue count will be entered in the counters (shown as approximately 5,000 in FIG. 5). Finally, when the delay of the calibration pulse is greater than the system clock period (i.e., the edges of the calibration pulse are greater than the jitter of the edges, both counters will have 0 count entered therein.

Figure 6:
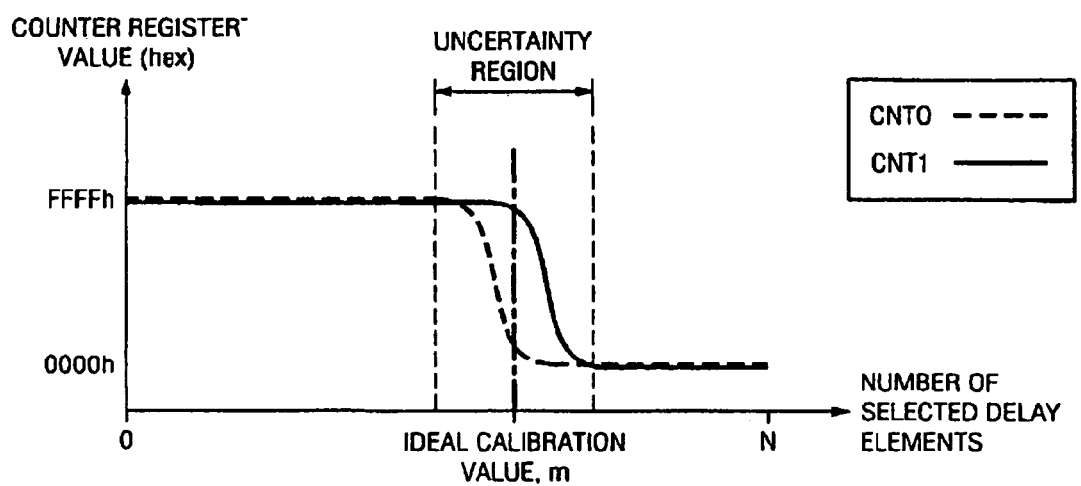
FIG. 6 illustrates the plot of the counts in the counter as a function of the number n of delay elements according to the present invention.

Referring to FIG. 6, the relationship of the counts in the counters CNT0 and CNT1 to the number of delay elements is shown. As the number n of delay elements in the path of the calibration signal is increased, the maximum number of counts is entered in CNT0 and CNT1. As the area of uncertainty is entered, i.e., the region where the sampling is performed on waveforms of questionable integrity, the counts in counter CNT0 and CNT1 decreases. (Note that in FIG. 3, the counts in the counters are approximately equal whereas in FIG. 6 the counts in the counter CNT0 and CNT1 are not equal. This difference is the result of differing assumptions concerning the instability in the instabilities in the edges of the calibration pulse.)

Figure 7:
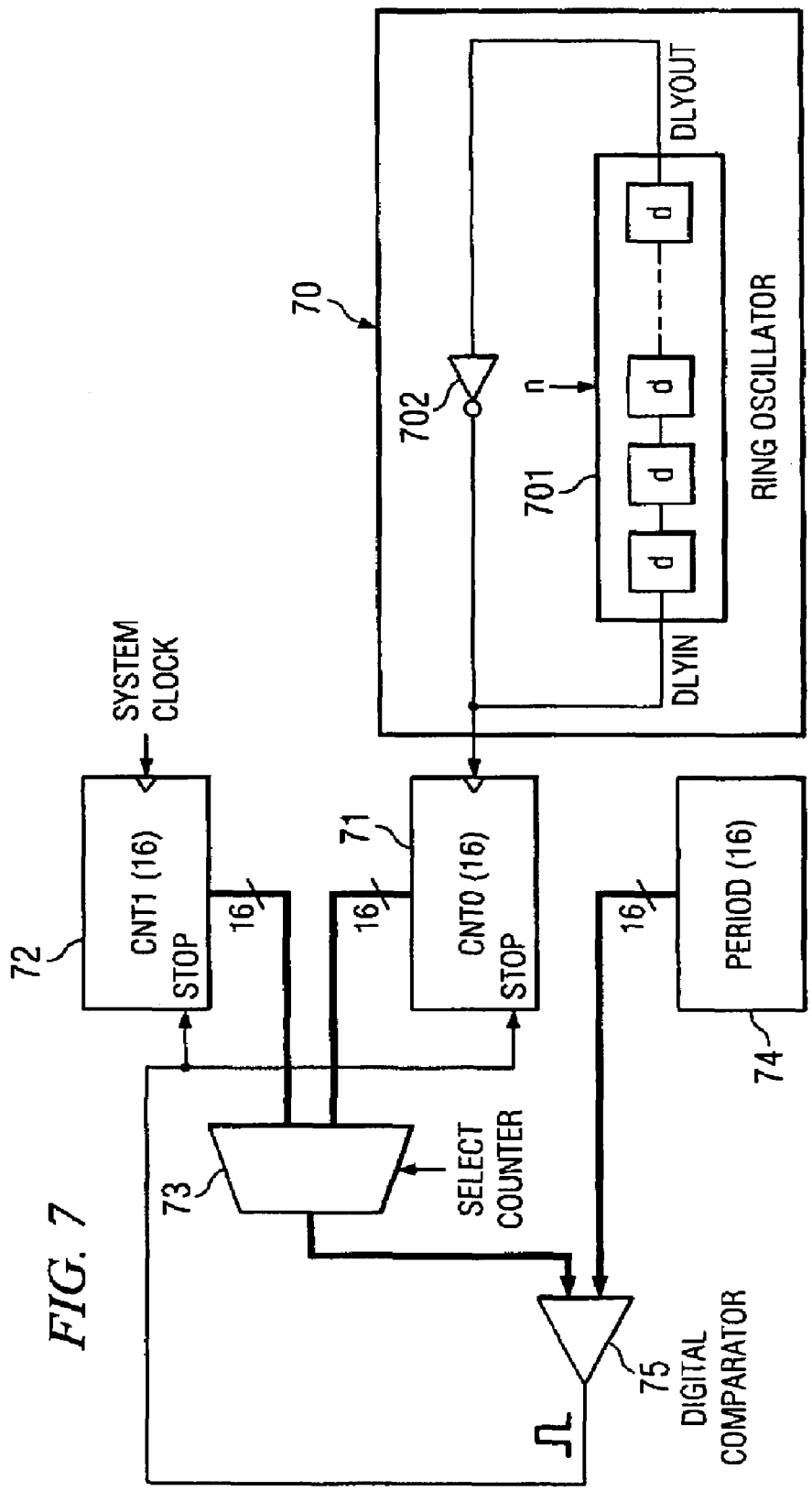
FIG. 7 is block diagram for a test and characterization of a delay line according to the present invention.

Referring to FIG. 7, a block diagram of calibration apparatus for a controllable delay line is shown. The delay line 702 with the controllable number n of delay elements has the output terminal coupled to the input terminal of inverting amplifier 702. The DYLOUT terminal of inverting amplifier 702 is coupled to the DYLIN terminal of delay line 701 and to an input terminal of counter CNT0. Inverting amplifier 702 and delay line 701 form a ring oscillator. The system clock is applied to an input terminal of CNT1. The contents of counter CNT0 and the contents of counter CNT1 are applied to multiplexer 73. A select counter control signal is applied to the control terminal of multiplexer 73 and determines which counter contents are applied the multiplexer output terminals. The output terminals of the multiplexer 73 are applied to one set of input terminals of digital comparator 75. A second set of input terminals of the digital comparator 75 receives the contents of period register 74. The output terminal of the digital comparator 75 is coupled to the stop terminal of counter CNT0 71 and counter CNT1 72

Figure 8:
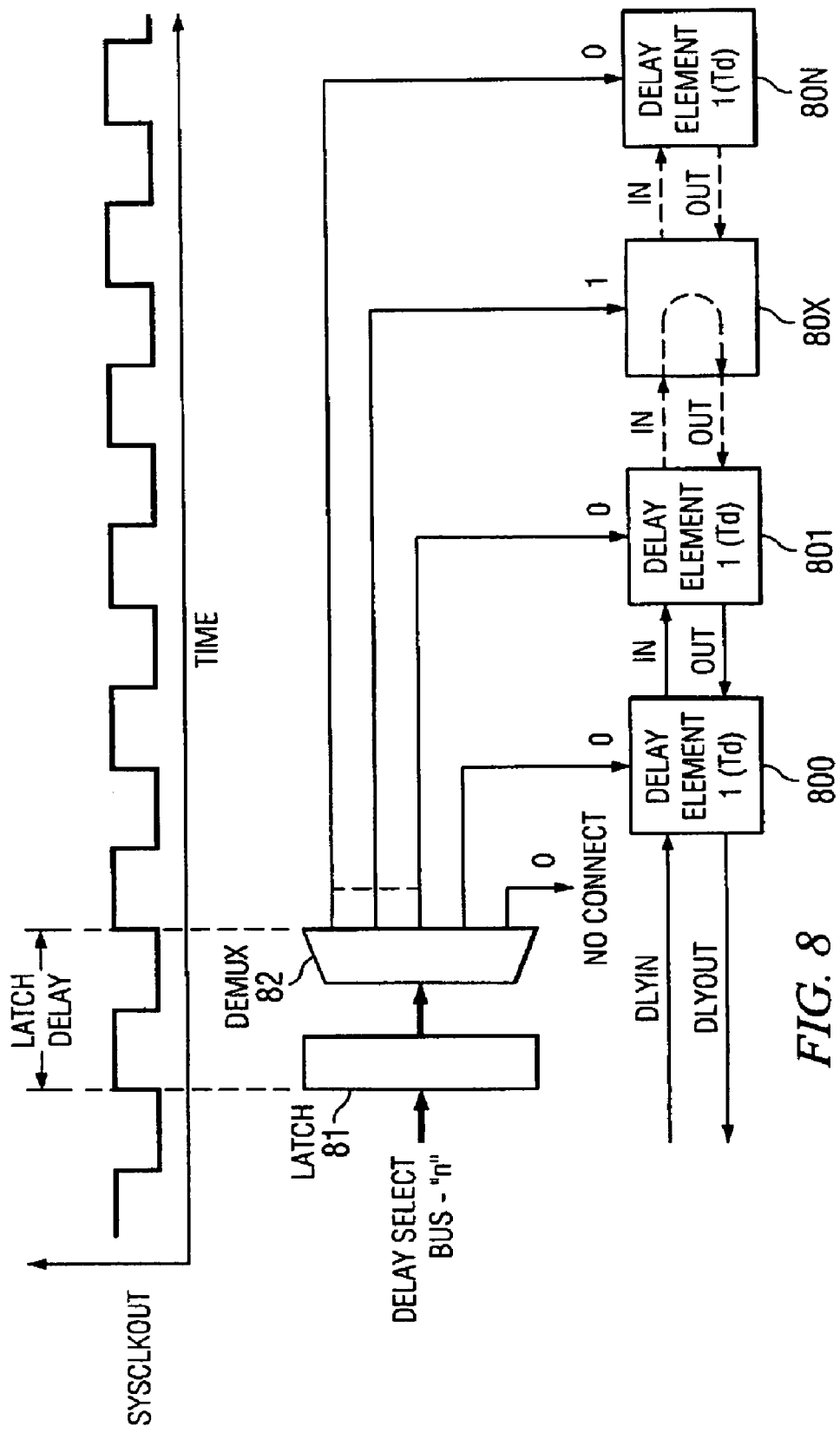
FIG. 8 is a block diagram for a delay line according to the present invention.

Referring to FIG. 8, a block diagram of a delay line suitable for use in the present invention is shown. The upper graph of FIG. 8 illustrates the time as function of the system clock. The accompanying block diagram illustrates that the delay line can be configured in one or two system clock cycles. The central processing unit applies a delay select "n" signal group to the latch buffer 81. The latch buffer 81 stores the delay select "n" signal group and applies the signal group to de-multiplex unit 82. Based on the delay select "n" signal group, the de-multiplex unit 82 selects one delay element 80$n$ of the delay elements 800 through 80N to activate. The activation of delay element 80$n$ causes a pulse passing through the activated delay element to be reflected and to be passed through delay elements 800 through 80$n$ in the opposite direction. In this manner, the pulse applied to the DLYIN input terminal of the delay line, after a round trip, is applied to the DLYOUT output terminal of the delay line.

Figure 9:
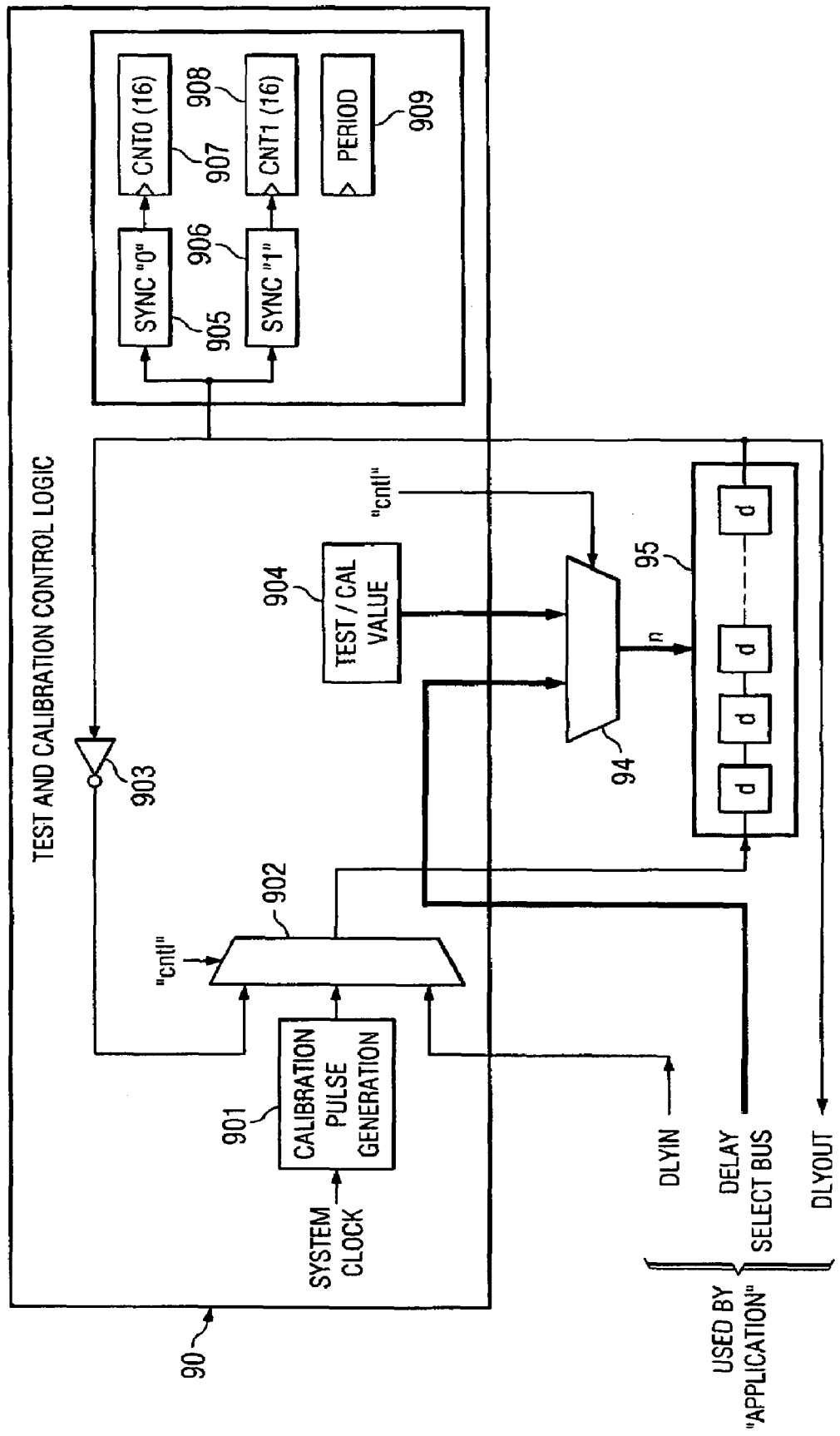
FIG. 9 is a block diagram of one implementation of the delay line test and calibration control apparatus according to the present invention.

Referring to FIG. 9, a block diagram of one implementation of the delay line test and calibration control apparatus according to the present invention is shown. Test and calibration control unit 90 includes a calibration pulse generator 901 that provides a calibration pulse in response to the system clock signals. The output signal from the calibration pulse generator 901 is applied to a first input terminal of multiplexer 902. A second input terminal of multiplexer 902 has the DLYIN signal applied thereto. A third input terminal of multiplexer 902 has the output signal from an inverting amplifier applied thereto. The multiplexer 902 has a CNT1 signal applied to the control terminal. The output terminal of multiplexer 902 is coupled to an input terminal of delay line 95. Signals on a delay select bus are applied to de-multiplexer 94. The output signals from a test and calibration register is applied to a second set of terminals of de-multiplexer 94. CNT1 signals are applied to control terminals of de-multiplexer 94. The output signal of de-multiplexer 94 selects the "n" delay element of delay line 95. The output terminal of delay line 95 provides an output signal on the DLYOUT terminal/line, applies the output signal to the input terminal of inverting amplifier 903, and applies the output signal to the SYCH0 unit 905 and to the SYNC1 unit 906. The SYNC0 905 unit applies signals to the CNT0 counter 907, while the SYNC1 unit 906 applies signals to the CNT1 counter 908. The system clock is applied to the period counter 909.

2. OPERATION OF THE PREFERRED EMBODIMENT

Summarizing, the present invention test time of elements of a delay line by generating a calibration pulse having the same period as the system clock. Then by varying the delay of the calibration pulse through the delay line, the passage of the delayed calibration pulse through a stationary (in time) clock cycle provides a measurement of the delay of each element. For calibration of the delay, the delay line is configured as ring oscillator and the frequency is compared with the system clock frequency to determine the delay.

The test procedure is illustrated in FIG. 4 and FIG. 5. By changing the number of delay elements of a one system clock cycle pulse, the exact time when the one clock cycle pulse is delayed by a selected amount, then by comparison the delay of the delay line elements can be determined.

With respect to the calibration technique, when in FIG. 7, the count in PERIOD counter is equal to the count in the CNT1 counter, ring oscillator frequency=(CNT0)/ $T_{SYS}$*PERIOD). $T_{SYS}$ is known and PERIOD is set by the user. Therefore, the ring oscillator frequency can be calculated for various values of n.

The present invention requires little extra apparatus and therefore can be fabricated on the chip that includes the delay line. Thus testing can be done early in the qualification process and calibration can be performed by the central processing unit at the time that delay line is needed.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. In a processing unit including a multi-element programmable delay line, a test apparatus for testing the delay line, the apparatus comprising:
   a testing unit, the testing unit including;
      a calibration pulse generating unit, the calibration pulse generating unit providing a pulse with leading and trailing edges separated by a predetermined interval;
      a first and a second logic state sampling units, the logic state sampling units sampling logic states at a time difference equal to the predetermined interval during passage through the delay line;
      a control circuit, the control circuit incrementing the number of delay elements through which the calibration pulses pass in the delay line; and
      an identification unit responsive to the first and second logic state sampling units, the identification unit determining for what number of delay elements the first and second logic state sampling units detect the leading and trailing edges simultaneously.

2. The apparatus recited in claim 1 wherein the predetermined interval is one system clock cycle.

3. The apparatus as recited in claim 1 wherein all the components used to test the delay line are fabricated on the same substrate as the delay line.

4. The test apparatus as recited in claim 1 wherein the identification unit includes storage elements for storing a multiplicity of logic states from the first and from the second logic state sampling units as a function of the number of delay elements.

5. The test apparatus as recited in claim 4 wherein a comparison of the logic states from the first logic state sampling unit as a function of number of delay elements and the logic states from the second logic state sampling unit as a function of the number of delay elements determines the delay element parameter.

* * * * *